(12) United States Patent
Ogawa et al.

(10) Patent No.: US 12,136,380 B2
(45) Date of Patent: Nov. 5, 2024

(54) DISPLAY DEVICE

(71) Applicant: Japan Display Inc., Tokyo (JP)

(72) Inventors: Yasuhiro Ogawa, Tokyo (JP); Tetsuo Morita, Tokyo (JP)

(73) Assignee: Japan Display Inc., Tokyo (JP)

( * ) Notice: Subject to any disclaimer, the term of this patent is extended or adjusted under 35 U.S.C. 154(b) by 723 days.

(21) Appl. No.: 17/236,004

(22) Filed: Apr. 21, 2021

(65) Prior Publication Data
US 2021/0241684 A1 Aug. 5, 2021

Related U.S. Application Data

(63) Continuation of application No. PCT/JP2019/033816, filed on Aug. 28, 2019.

(30) Foreign Application Priority Data

Oct. 26, 2018 (JP) .................................. 2018-201944

(51) Int. Cl.
*G09G 3/32* (2016.01)
*H01L 25/075* (2006.01)
(Continued)

(52) U.S. Cl.
CPC ............ *G09G 3/32* (2013.01); *H01L 25/0753* (2013.01); *H01L 33/32* (2013.01); *H01L 33/62* (2013.01); *G09G 2300/0426* (2013.01)

(58) Field of Classification Search
CPC ............. G09G 3/32; G09G 2300/0426; G09G 2300/0804; G09G 2300/0443–0447; G09G 2300/0421–0434; G09G 2330/00–028; H01L 25/0753; H01L 25/167; H01L 33/00–648; H01L 27/15–156; H01L 2933/00–0091;
(Continued)

(56) References Cited

U.S. PATENT DOCUMENTS

2013/0153945 A1* 6/2013 Kobayashi ............. H05K 3/242
438/27
2013/0192880 A1* 8/2013 Nakanishi ................ H05K 3/00
174/251
(Continued)

OTHER PUBLICATIONS

International Search Report mailed on Nov. 12, 2019 for the PCT Application No. PCT/JP2019/033816, with English translation.

*Primary Examiner* — Cuong B Nguyen
*Assistant Examiner* — Anthony A Pulatov
(74) *Attorney, Agent, or Firm* — Michael Best & Friedrich LLP

(57) ABSTRACT

According to one embodiment, a display device includes first wiring layers, a second wiring layer, a first insulating layer, first mounting electrodes, a second mounting electrode, a first light emitting element and a second light emitting element. The second mounting electrode is arranged to surround a first mounting electrode and an other first mounting electrode. The first light emitting element is mounted across the first mounting electrode and the second mounting electrode. The second light emitting element is mounted across the other first mounting electrode and the second mounting electrode. The second mounting electrode is electrically connected to the second wiring layer through a second opening of the first insulating layer, in a non-display area.

12 Claims, 14 Drawing Sheets

(51) Int. Cl.
*H01L 33/32* (2010.01)
*H01L 33/62* (2010.01)

(58) Field of Classification Search
CPC .. G09F 9/30; G09F 9/33; H05B 33/06; H05B 33/26–28
See application file for complete search history.

(56) References Cited

U.S. PATENT DOCUMENTS

2018/0068986 A1 3/2018 Yoo et al.
2018/0145056 A1 3/2018 Yoo et al.

* cited by examiner

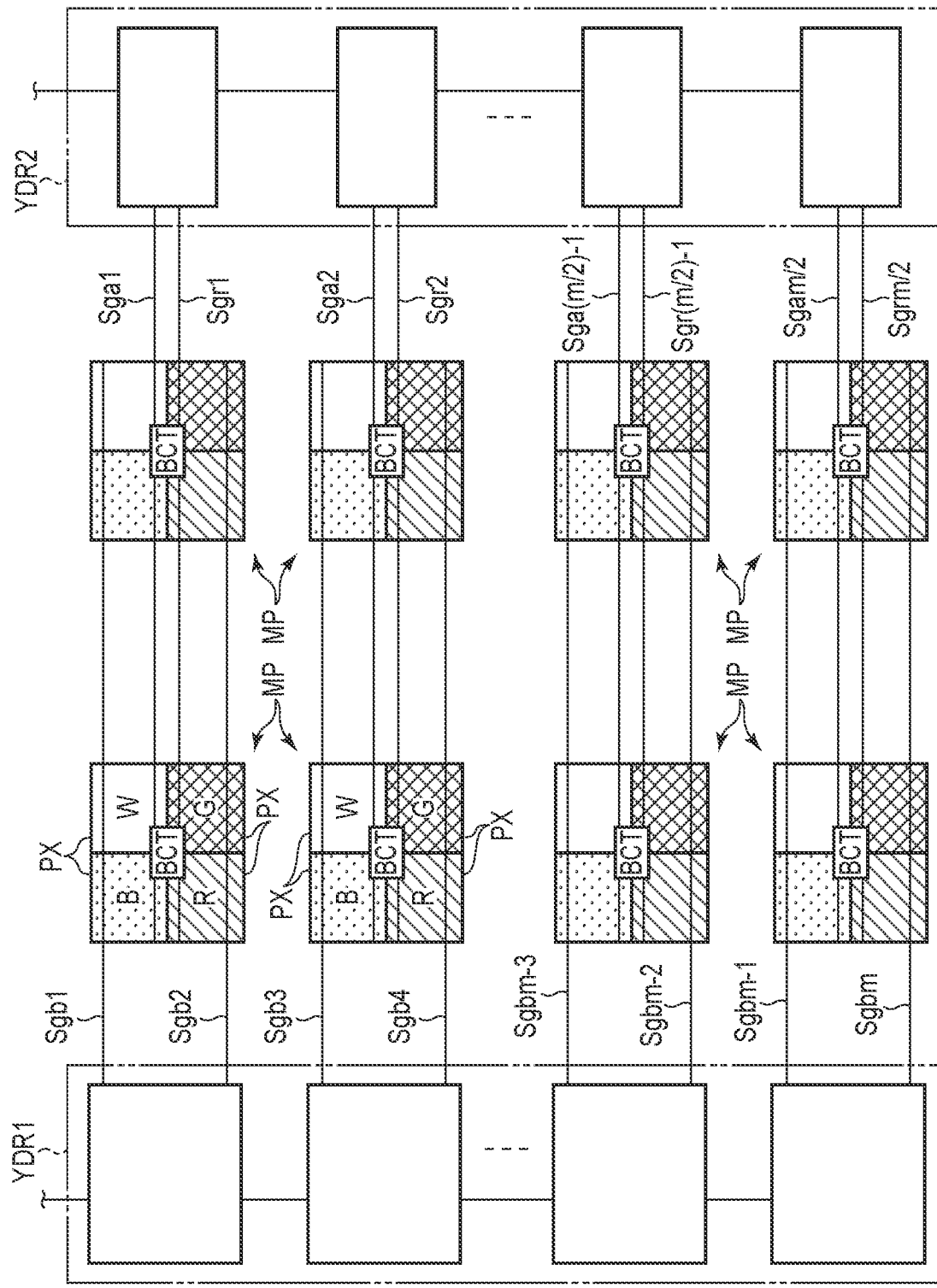
F I G. 5

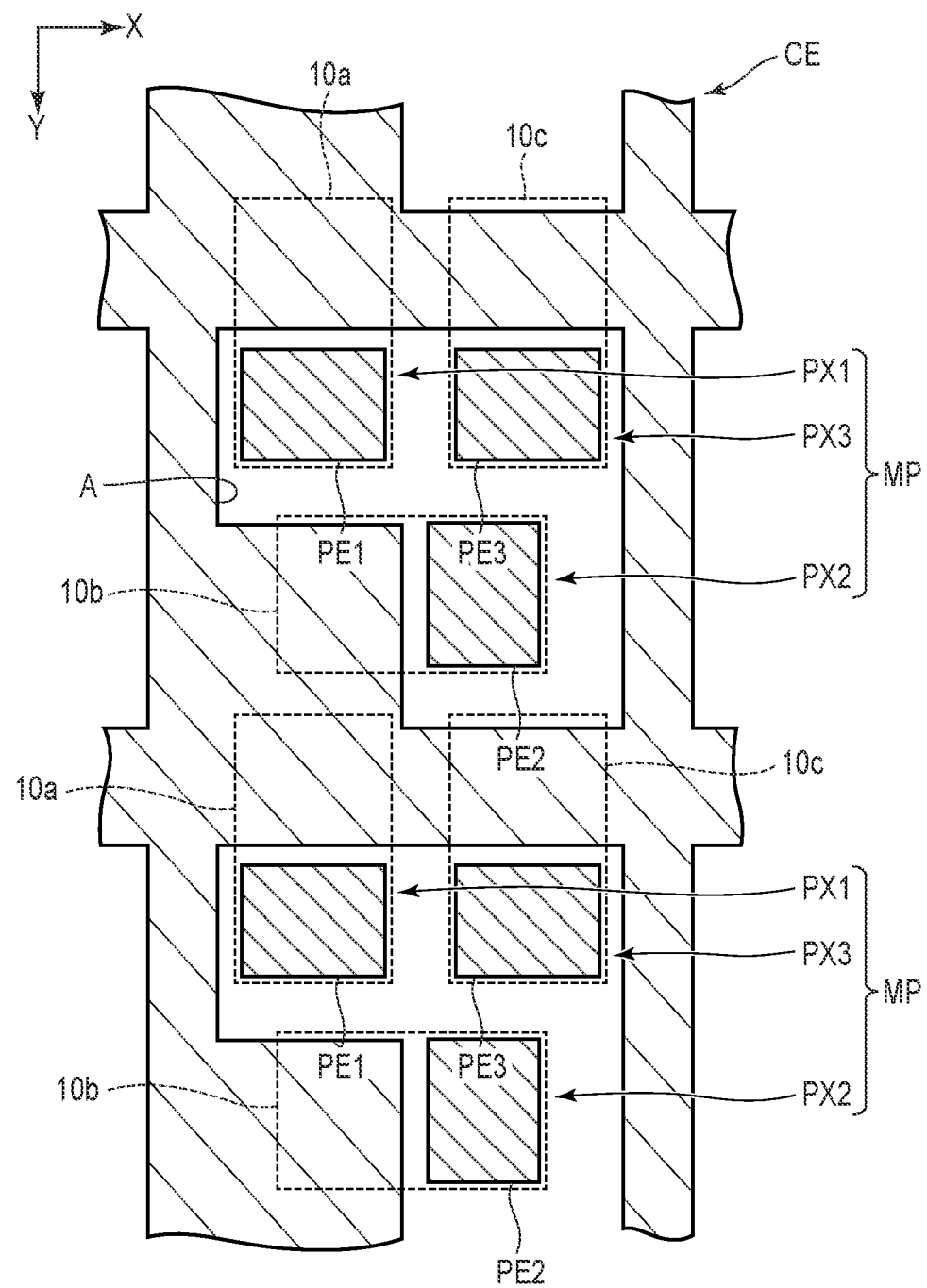
F I G. 17

DISPLAY DEVICE

CROSS-REFERENCE TO RELATED APPLICATIONS

This application is a Continuation Application of PCT Application No. PCT/JP2019/033816, filed Aug. 28, 2019 and based upon and claiming the benefit of priority from Japanese Patent Application No. 2018-201944, filed Oct. 26, 2018, the entire contents of all of which are incorporated herein by reference.

FIELD

Embodiments described herein relate generally to a display device.

BACKGROUND

LED display devices using light emitting diodes (LED) that are spontaneous light-emitting elements are known as display devices. Recently, a display device (hereinafter referred to as a micro-LED display device) in which minute light-emitting diodes referred to as micro-LED are mounted on an array substrate has been developed as a higher definition display device.

Since the micro-LED display is formed such that a large number of chip-like micro-LED are mounted in the display area, unlike the conventional liquid crystal display or organic EL display, both higher definition and larger scale of the display can easily be achieved and the display is focused as a next generation display device.

BRIEF DESCRIPTION OF THE DRAWINGS

FIG. 4 is a partially cross-sectional view showing a display area of the display panel shown in FIG. 1, illustrating a drive transistor, a first mounting electrode, a second mounting electrode, a light emitting element, and the like.

FIG. 5 is a schematic diagram showing an arrangement configuration of a plurality of pixels of the display device.

FIG. 8 is a partially cross-sectional view showing a display area and a non-display area of the display panel taken along line VIII-VIII of FIG. 7, illustrating the power line, the second mounting electrode, and the like.

FIG. 10 is a cross-sectional view showing a part of the display area of the display panel, illustrating the first mounting electrodes, the second mounting electrode, the light emitting elements, and the like.

FIG. 16 is a cross-sectional view showing a part of the display area of the display panel according to the modified example 3, illustrating the first mounting electrodes, the second mounting electrode, the light emitting element, and the like.

FIG. 17 is an enlarged plan view showing a plurality of first mounting electrodes and second mounting electrode of the display device according to a modified example 4 of the second embodiment.

DETAILED DESCRIPTION

In general, according to one embodiment, there is provided a display device comprising: a plurality of first wiring layers provided on a substrate and located in a display area; a second wiring layer provided on the substrate and located in a non-display area other than the display area; a first insulating layer located in the display area and the non-display area, covering the plurality of first wiring layers and the second wiring layer, and including a plurality of first openings exposing parts of the plurality of first wiring layers, respectively; a plurality of first mounting electrodes located in the display area and provided on the first insulating layer, each of the first mounting electrodes being electrically connected to one of the plurality of first wiring layers through one of the plurality of first openings; a second mounting electrode provided on the first insulating layer and located in the display area and the non-display area; a first light emitting element; and a second light emitting element. The second mounting electrode is arranged to surround a first mounting electrode of the plurality of first mounting electrodes and an other first mounting electrode of the plurality of first mounting electrodes. The first light emitting element is mounted across the one of the first mounting electrodes and the second mounting electrode, and includes a first electrode electrically connected to the one of the first mounting electrodes and a second electrode electrically connected to the second mounting electrode. The second light emitting element is mounted across the other one of the first mounting electrodes and the second mounting electrode, and includes a first electrode electrically connected to the other one of the first mounting electrodes and a second electrode electrically connected to the second mounting electrode. The first insulating layer includes a second opening located in the non-display area. The second mounting electrode is electrically connected to the second wiring layer through the second opening, in the non-display area.

Embodiments will be described hereinafter with reference to the accompanying drawings. The disclosure is merely an example, and proper changes within the spirit of the invention, which are easily conceivable by a skilled person, are included in the scope of the invention as a matter of course.

To more clarify the explanations, the drawings may pictorially show width, thickness, shape, etc., of each portion as compared with an actual aspect, but they are mere examples and do not restrict the interpretation of the invention. In the present specification and drawings, elements like or similar to those in the already described drawings may be denoted by similar reference numbers and their detailed descriptions may be arbitrarily omitted.

First Embodiment

Figure 1:
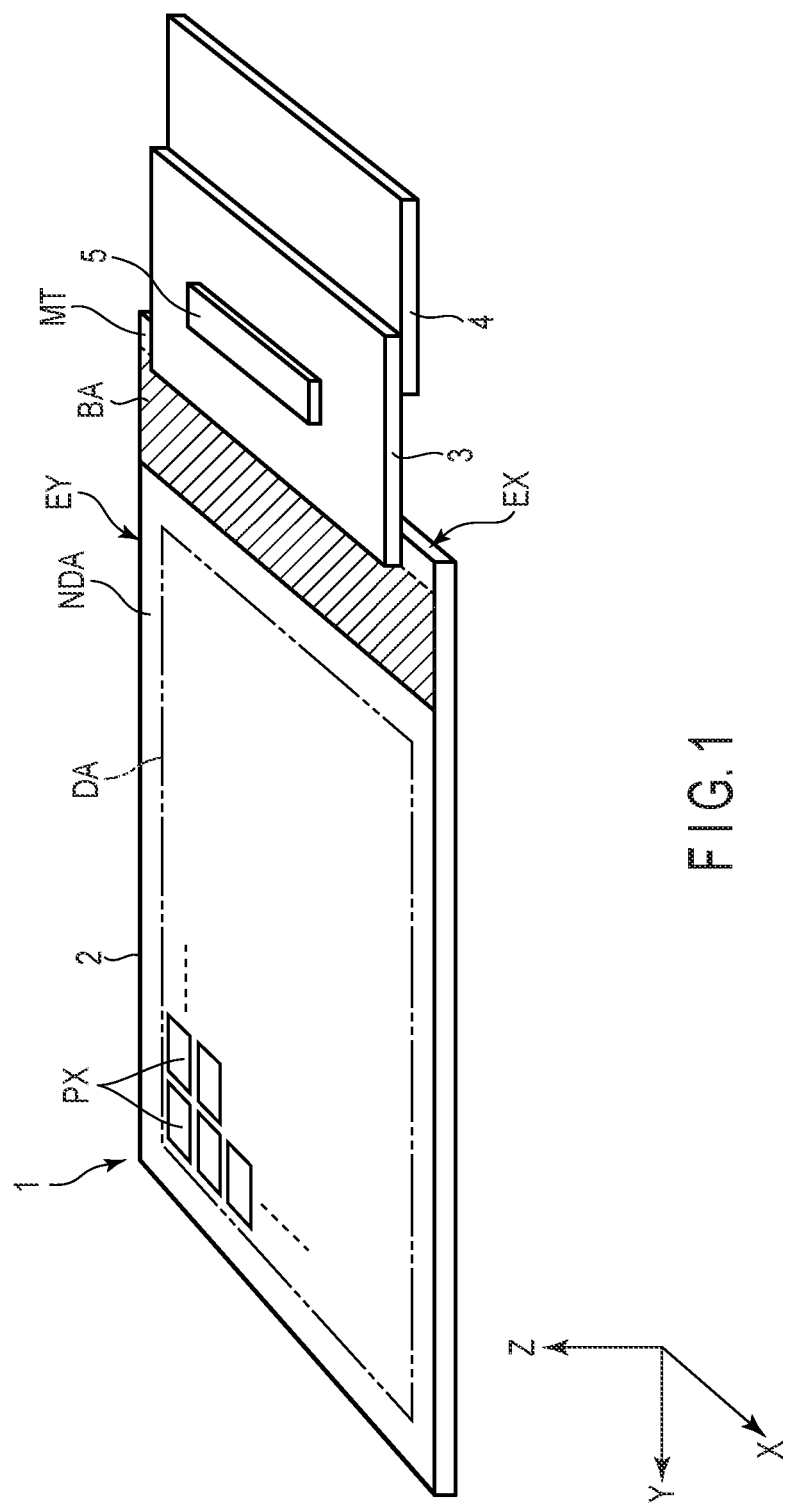
FIG. 1 is a perspective view showing a structure of a display device according to a first embodiment.

First, a display device according to the first embodiment will be described. FIG. 1 is a perspective view showing a configuration of a display device 1 according to the present embodiment. FIG. 1 shows a three-dimensional space defined by a first direction X, a second direction Y perpendicular to the first direction X, and a third direction Z perpendicular to the first direction X and the second direction Y. The first direction X and the second direction Y are orthogonal to each other, but may intersect at an angle other than 90°. In addition, the third direction Z is defined as an upper or upward direction while a direction opposite to the third direction Z is defined as a lower or downward direction, in the present embodiment. According to "a second member above/on a first member" and "a second member below/under a first member", the second member may be in contact with the first member or may be remote from the first member.

In the present embodiment, an example that the display device 1 is a micro-LED display device using a micro-light-emitting diode [hereinafter referred to as a micro-light emitting diode (micro-LED), which is a spontaneous light-emitting element] will be mainly described below.

As shown in FIG. 1, the display device 1 comprises a display panel 2, a first circuit board 3, a second circuit board 4, and the like.

The display panel 2 has, for example, a rectangular shape. In the example illustrated, shorter sides EX of the display panel 2 are parallel to the first direction X and longer sides EY of the display panel 2 are parallel to the second direction Y. The third direction Z corresponds to a thickness direction of the display panel 2. The main surface of the display panel 2 is parallel to an X-Y plane defined by the first direction X and the second direction Y. The display panel 2 includes a display area DA and a non-display area NDA other than the display area DA. The non-display area NDA includes a terminal area MT. In the example illustrated, the non-display area NDA surrounds the display area DA.

The display area DA is a region for displaying an image and includes, for example, a plurality of pixels PX arrayed in a matrix.

The terminal area MT is provided along the shorter sides EX of the display panel 2 and includes terminals for electrically connecting the display panel 2 to an external device and the like.

The first circuit board 3 is mounted on the terminal area MT and is electrically connected to the display panel 2. The first circuit board 3 is, for example, a flexible printed circuit. The first circuit board 3 comprises a driver IC chip (hereinafter referred to as a panel driver) 5 which drives the display panel 2, and the like. Incidentally, in the example illustrated, the panel driver 5 is arranged on the first circuit board 3 but may be arranged under the first circuit board 3. Alternatively, the panel driver 5 may be mounted on a part other than the first circuit board 3, for example, the second circuit board 4. The second circuit board 4 is, for example, a flexible printed circuit. The second circuit board 4 is connected to the first circuit board 3, for example, at a position under the first circuit board 3.

The above-described panel driver 5 is connected to a control board (not shown) via, for example, the second circuit board 4. For example, the panel driver 5 performs control of displaying an image on the display panel 2 by driving a plurality of pixels PX, based on an image signal output from the control boards.

Incidentally, the display panel 2 may include a fold area BA represented by hatch lines. The fold area BA is a region which is folded when the display device 1 is accommodated in the housing of the electronic apparatus or the like. The fold area BA is located on the terminal region MT side of the non-display area NDA. In a state in which the fold area BA is folded, the first circuit board 3 and the second circuit board 4 are arranged under the display panel 2 so as to be opposed to the display panel 2.

Figure 2:
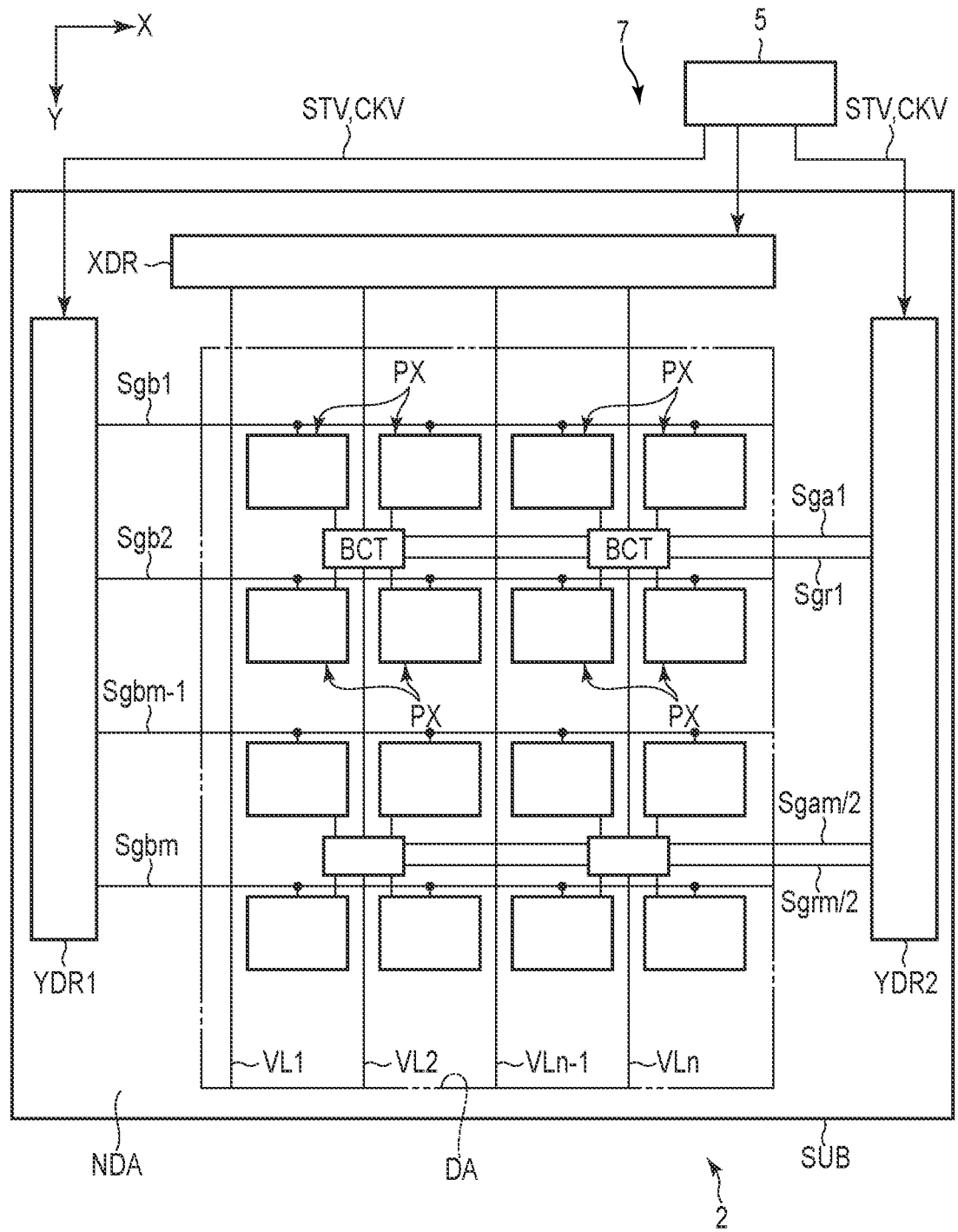
FIG. 2 is a circuit diagram showing the display device.
Figure 3:
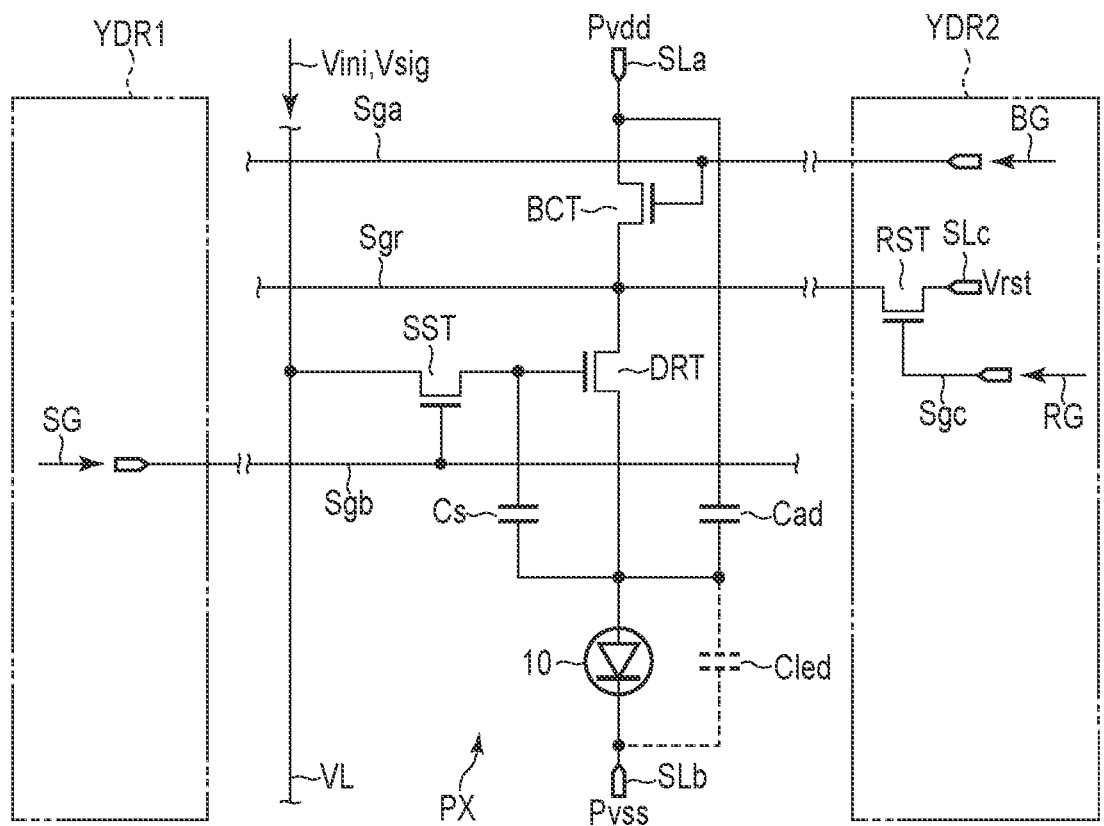
FIG. 3 is an equivalent circuit diagram showing a pixel shown in FIG. 2.

FIG. 2 is a circuit diagram showing the display device 1. FIG. 3 is an equivalent circuit diagram showing the pixel PX shown in FIG. 2.

As shown in FIG. 2 and FIG. 3, the display panel 2 comprises an insulating substrate SUB having an optical transparency such as a rein substrate or a glass substrate, m×n pixels PX arrayed in a matrix on the substrate SUB in the display area DA, a plurality of (m/2) first scanning lines Sga (1 to m/2), a plurality of (m) second scanning lines Sgb (1 to m), a plurality of (m/2) third scanning lines Sgc (1 to m/2), a plurality of (m/2) reset lines Sgr (1 to m/2), and a plurality of (n) video signal lines VL (1 to n).

In this example, m pixels PX are arranged in the second direction Y and n pixels PX are arranged in the first direction X. The first scanning lines Sga, the second scanning lines Sgb, and the reset lines Sgr are provided so as to extend in the first direction X. The reset lines Sgr are formed of a plurality of electrodes electrically connected to each other. The video signal lines VL are provided so as to extend in the second direction Y.

The display panel 2 includes a high potential power supply line SLa fixed to a high potential Pvdd and a low potential power supply electrode (second mounting electrode) SLb fixed to a low potential Pvss. The high potential power supply line SLa is connected to the high potential power supply, and the low potential power supply electrode SLb is connected to the low potential power supply (reference potential power supply).

The display panel 2 comprises scanning line drive circuits YDR1 and YDR2 that sequentially drive the first scanning lines Sga, the second scanning lines Sgb, and the third scanning lines Sgc for each row of the pixels PX, and a signal line drive circuit XDR that drives the video signal lines VL. The scanning line drive circuits YDR1 and YDR2 and the signal line drive circuit XDR are formed on the substrate SUB in the non-display area NDA and constitute the driver 7 together with the panel driver 5.

Each of the pixels PX includes a light emitting element and a pixel circuit that supplies a drive current to the light emitting element. The light emitting element 10 is, for example, a self-luminous element, and is a micro-light-emitting diode (hereinafter referred to as a micro-LED [Light Emitting Diode]) in the present embodiment. The display device 1 of the present embodiment is a micro-LED display device.

The pixel circuit of each pixel PX is a voltage signal type pixel circuit that controls light emission of the light emitting element 10 in accordance with a video signal Vsig composed of a voltage signal, and includes a pixel switch SST, a drive transistor DRT, a storage capacitance Cs, and an auxiliary capacitance Cad. The storage capacitance Cs and the auxiliary capacitance Cad are capacitors. The auxiliary capacitance Cad is an element provided to adjust the amount of light emission current and may be unnecessary in some cases. The capacitance unit Cled is the capacitance of the light emitting element 10 itself. The light emitting element 10 also functions as a capacitor.

Each of the pixels PX comprises an output switch BCT. A plurality of pixels PX adjacent in the second direction Y share an output switch BCT. In the present embodiment, four pixels PX adjacent in the first direction X and the second direction Y share one output switch BCT. In addition, a plurality of reset switches RST are provided in the scanning line drive circuit YDR2 (or the scanning line drive circuit YDR1). The reset switch RST and the reset lines Sgr are connected in a one-to-one relationship.

The pixel switch SST, the drive transistor DRT, the output switch BCT, and the reset switch RST are composed of thin film transistors (TFT) of the same conductive type, for example, an N channel type. Of course, the various switches and drive transistor DRT may be configured by P-channel TFTs, or one pixel PX may be configured by using both the N-channel TFT and the P-channel TFT.

In the display device according to the present embodiment, all the TFTs that configure the respective drive transistors and the switches are formed in the same process and have the same layer structure, and are top-gate thin film transistors using polycrystalline silicon for the semiconductor layer. Incidentally, the semiconductor layer may use a semiconductor other than polycrystalline silicon, such as amorphous silicon or an oxide semiconductor.

Each of the pixel switch SST, the drive transistor DRT, the output switch BCT, and the reset switch RST includes a first terminal, a second terminal, and a control terminal. In the present embodiment, the first terminal is used as a source electrode, the second terminal is used as a drain electrode, and the control terminal is used as a gate electrode.

In the pixel circuit of the pixel PX, the drive transistor DRT and the output switch BCT are connected in series with the light emitting element 10 at positions between the high potential power supply line SLa and the low potential power supply electrode SLb. The high potential power supply line SLa (high potential Pvdd) is set to a potential of, for example, 10 V and the low potential power supply electrode SLb (low potential Pvss) is set to a potential of, for example, 0 V.

In the output switch BCT, the drain electrode is connected to the high potential power supply line SLa, the source electrode is connected to the drain electrode of the drive transistor DRT, and the gate electrode is connected to the first scanning line Sga. The output switch BCT is thereby controlled to be on (conductive state) or off (non-conductive state) by a control signal BG supplied to the first scanning line Sga. The output switch BCT controls the light emission time of the light emitting element 10 in response to the control signal BG.

In the drive transistor DRT, the drain electrode is connected to the source electrode of the output switch BCT and the reset line Sgr, and the source electrode is connected to one of electrodes (in this example, an anode) of the light emitting element 10. The other electrode (in this example, a cathode) of the light emitting element 10 is connected to the low potential power supply electrode SLb. The drive transistor DRT outputs a drive current having a current amount corresponding to the video signal Vsig to the light emitting element 10.

In the pixel switch SST, the source electrode is connected to the video signal line VL (1 to n), the drain electrode is connected to the gate electrode of the drive transistor DRT, and the gate electrode is connected to the second scanning line Sgb (1 to m) that functions as a gate line for signal write control. The pixel switch SST is controlled to be on and off by a control signal SG (1 to m) supplied from the second scanning line Sgb. Then, the pixel switch SST controls connection and disconnection between the pixel circuit and the video signal line VL (1 to n) and takes an image signal Vsig and an initialization signal Vini from the video signal line VL into the pixel circuit, in response to the control signal SG (1 to m).

The reset switch RST is provided in every two rows lined up in the second direction Y in the scanning line drive circuit YDR2. The reset switch RST is connected between the drain electrode of the drive transistor DRT and the reset power supply. In the reset switch RST, the source electrode is connected to the reset power supply line SLc connected to the reset power supply, the drain electrode is connected to the reset line Sgr, and the gate electrode is connected to the third scanning line Sgc that functions as a gate line for reset control. As described above, the reset power supply line SLc is connected to the reset power supply and fixed to the reset potential Vrst that is a constant potential.

The reset switch RST switches a part between the reset power supply line SLc and the reset line Sgr to the conductive state (on) or the non-conductive state (off) in accordance with the control signal RG supplied in the third scanning line Sgc. When the reset switch RST is switched to be the on state, the potential of the source electrode of the drive transistor DRT is initialized.

In contrast, the panel driver 5 shown in FIG. 2 controls the scanning line drive circuits YDR1 and YDR2 and the signal line drive circuit XDR. The panel driver 5 receives a digital video signal and a synchronization signal supplied from the outside, and generates a vertical scanning control signal for controlling vertical scanning timing and a horizontal scanning control signal for controlling horizontal scanning timing, based on the synchronization signal.

Then, the panel driver 5 supplies the vertical scanning control signal and the horizontal scanning control signal to each of the scanning line drive circuits YDR1 and YDR2 and the signal line drive circuit XDR, and supplies the digital video signal and the initialization signal to the signal line drive circuit XDR in synchronization with the horizontal and vertical scanning timing.

The signal line drive circuit XDR converts digital video signals sequentially obtained in each horizontal scanning period under the control of the horizontal scanning control signal into an analog format and supplies video signals Vsig corresponding to gradation to a plurality of video signal lines VL (1 to n) in parallel. In addition, the signal line drive circuit XDR supplies the initialization signal Vini to the video signal line VL. Incidentally, the digital video signal may be converted into an analog format inside the panel driver 5 and supplied to the signal line drive circuit XDR in the analog format.

The scanning line drive circuits YDR1 and YDR2 include a shift register, an output buffer, and the like (not shown), and output pulses based on a horizontal scanning start pulse supplied from the outside and sequentially transfer the pulses to a next stage, and supplies three types of control signals, i.e., control signals BG, SG, and RG to the pixels PX of each row via the output buffer. Incidentally, although the control signal RG is not directly supplied to the pixel PX, a predetermined voltage is supplied from the reset power supply line SLc fixed to the reset potential Vrst at predetermined timing corresponding to the control signal RG.

The first scanning line Sga, the second scanning line Sgb, and the third scanning line Sgc are thereby driven by the control signals BG, SG, and RG, respectively.

Figure 4:
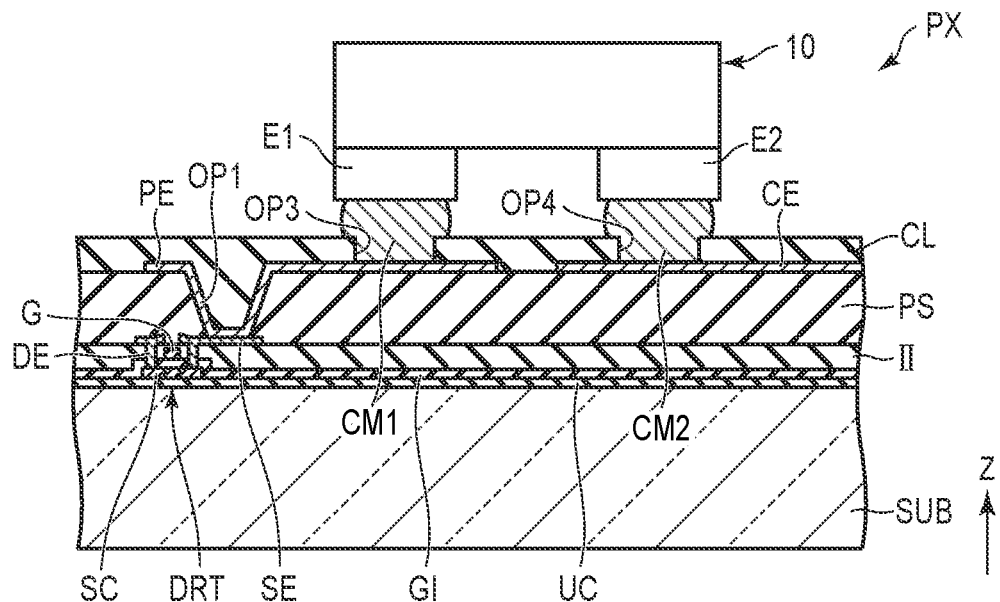

Next, a configuration of the drive transistor DRT, the first mounting electrode PE, the second mounting electrode CE, the light emitting element 10, and the like will be described in detail with reference to FIG. 4. FIG. 4 is a partially cross-sectional view showing a display area DA of the display panel 2 shown in FIG. 1, illustrating drive transistor DRT, the first mounting electrode PE, the second mounting electrode CE, the light emitting element 10, and the like. Incidentally, in FIG. 4, the display device 1 is drawn such that the display surface, i.e., the light emitting surface faces upward and the back surface faces downward.

As shown in FIG. 4, the N-channel TFT that forms the drive transistor DRT comprises a semiconductor layer SC. The semiconductor layer SC is arranged on an insulating layer UC provided on the substrate SUB. The semiconductor layer SC is, for example, a polycrystalline silicon layer including a p-type region and an n-type region. The semiconductor layer SC is covered with an insulating layer GI. A gate electrode G of the drive transistor DRT is arranged on the insulating layer GI. The gate electrode G faces the semiconductor layer SC. An insulating layer II is provided on the insulating layer GI and the gate electrode G.

A source electrode SE and a drain electrode DE are arranged on the insulating layer II. The source electrode SE and the drain electrode DE are connected to the source region and the drain region of the semiconductor layer SC, respectively, through a contact hole formed in the insulating layer II and the insulating layer GI. The source electrode SE is provided on the substrate SUB and functions as a first wiring layer located in the display area DA. An insulating layer PS is provided on the insulating layer II, the source electrode SE, and the drain electrode DE. The insulating layer PS covers the source electrode SE and the drain electrode DE. The insulating layer PS includes a first opening (contact hole) OP1 that exposes a part of the source electrode SE. Incidentally, the insulating layer PS includes a plurality of first openings OP1 and each of the first openings OP1 exposes a part of the corresponding source electrode SE. The insulating layer PS functions as a first insulating layer.

The first mounting electrode PE and the second mounting electrode CE are provided on the insulating layer PS. The first mounting electrode PE is electrically connected to the source electrode SE through the first opening OP1. In the present embodiment, the first mounting electrode PE and the second mounting electrode CE are formed of metal as conductive members. However, the first mounting electrode PE and the second mounting electrode CE may be formed of a conductive material other than metal, for example, indium tin oxide (ITO) which is a transparent conductive material.

An insulating layer CL is provided on the insulating layer PS, the first mounting electrode PE, and the second mounting electrode CE, and the insulating layer CL covers the first mounting electrode PE and the second mounting electrode CE. The insulating layer CL functions as a second insulating layer and includes a plurality of openings through which a part of the upper surface of the first mounting electrode PE and a part of the upper surface of the second mounting electrode CE are exposed.

In the display area DA, the plurality of openings (contact holes) included in the insulating layer CL are classified into a third opening OP3 and a fourth opening OP4. A part of the upper surface of the first mounting electrode PE is exposed outside the insulating layer CL through the third opening OP3. A part of the upper surface of the second mounting electrode CE is exposed outside the insulating layer CL through the fourth opening OP4. The first mounting electrode PE and the second mounting electrode CE are located between the insulating layer PS and the insulating layer CL. For this reason, the first mounting electrode PE and the second mounting electrode CE are provided in the same layer.

The insulating layers UC, GI, II, PS and CL are each formed of an inorganic insulating material such as silicon nitride (SiN) or silicon oxide (SiO) or an organic insulating material such as acrylic resin. In the present embodiment, the insulating layers UC, GI, II, and CL are each formed of an inorganic insulating material, and the insulating layer PS is formed of an organic insulating material.

The light emitting element 10 is mounted across the first mounting electrode PE and the second mounting electrode CE. The light emitting element 10 includes a first electrode E1 electrically connected to the first mounting electrode PE through the third opening OP3, and a second electrode E2 electrically connected to the second mounting electrode CE through the fourth opening OP4. In the present embodiment, the first electrode E1 is electrically connected to the first mounting electrode PE via a conductive member CM1, and the second electrode E2 is electrically connected to the second mounting electrode CE via a conductive member CM2.

Next, an arrangement configuration of the plurality of pixels PX will be described. FIG. 5 is a schematic diagram showing an arrangement configuration of a plurality of pixels PX of the display device 1.

As shown in FIG. 5, the plurality of pixels PX include a blue (B) pixel PX, a red (R) pixel PX adjacent to the blue pixel PX in the second direction Y, a white (W) pixel PX adjacent to blue pixel PX in the first direction X, and a green (G) pixel PX adjacent to the red pixel PX in the first direction X and adjacent to the white pixel PX in the second direction Y. The white (W) pixel PX is also referred to as an achromatic pixel.

The red pixel PX, the green pixel PX, the blue pixel PX, and the white pixel PX form a main pixel MP. The plurality of main pixels MP are arrayed in a matrix in the first direction X and the second direction Y. When the plurality of main pixels MP are arranged as described above, the arrangement of the pixels PX is not limited to the example shown in FIG. 5, but any two pixels of the red, green, blue, and white pixels PX may be arranged in even-numbered rows and the remaining two pixels may be arranged in odd-numbered rows.

The output switch BCT is shared by four pixels PX of the main pixel MP. From the above, the number of the first scanning lines Sga and the third scanning lines Sgc is m/2.

In addition, the four pixels PX of the main pixel MP may be arranged in a stripe shape in the first direction X. In addition, the main pixel MP may include three (three-color) pixels PX of red, green, and blue without the white pixel PX.

Figure 6:
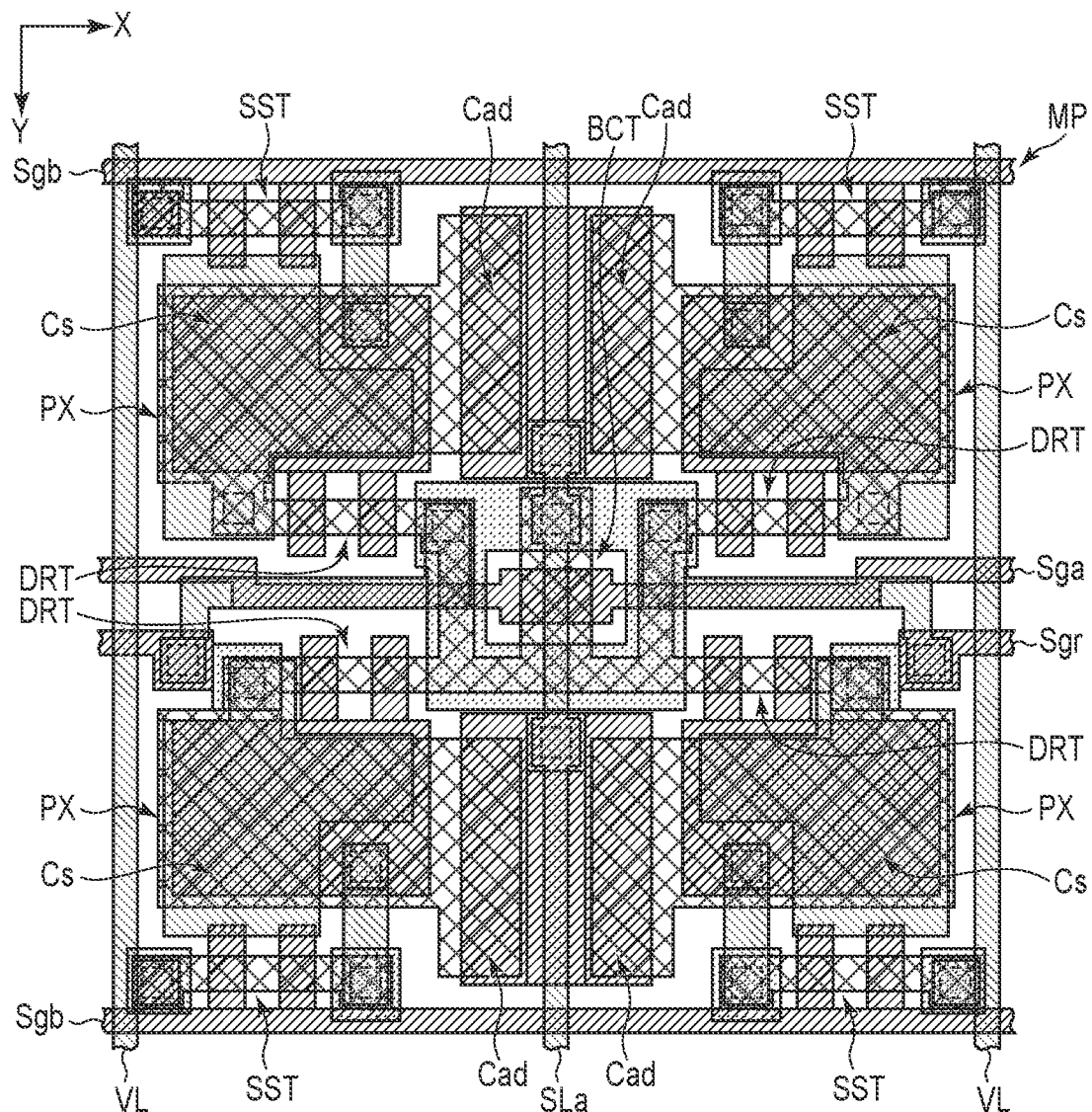
FIG. 6 is a plan view showing a main pixel shown in FIG. 5.

FIG. 6 is a plan view showing the main pixel MP according to the present embodiment.

As shown in FIG. 6, in the four pixels PX sharing (owning) the output switch BCT, the drive transistor DRT, the pixel switch SST, the video signal line VL, the storage capacitor Cs, the auxiliary capacitance Cad, and the second scanning line Sgb are arranged substantially in line symmetry with respect to the output switch BCT in the column direction and the row direction, in order to efficiently arrange the elements in the pixel circuit. The present embodiment has been described with the terms, pixel PX and main pixel MP. However, the pixel can be restated as a sub-pixel. In this case, the main pixel is the pixel.

Figure 7:
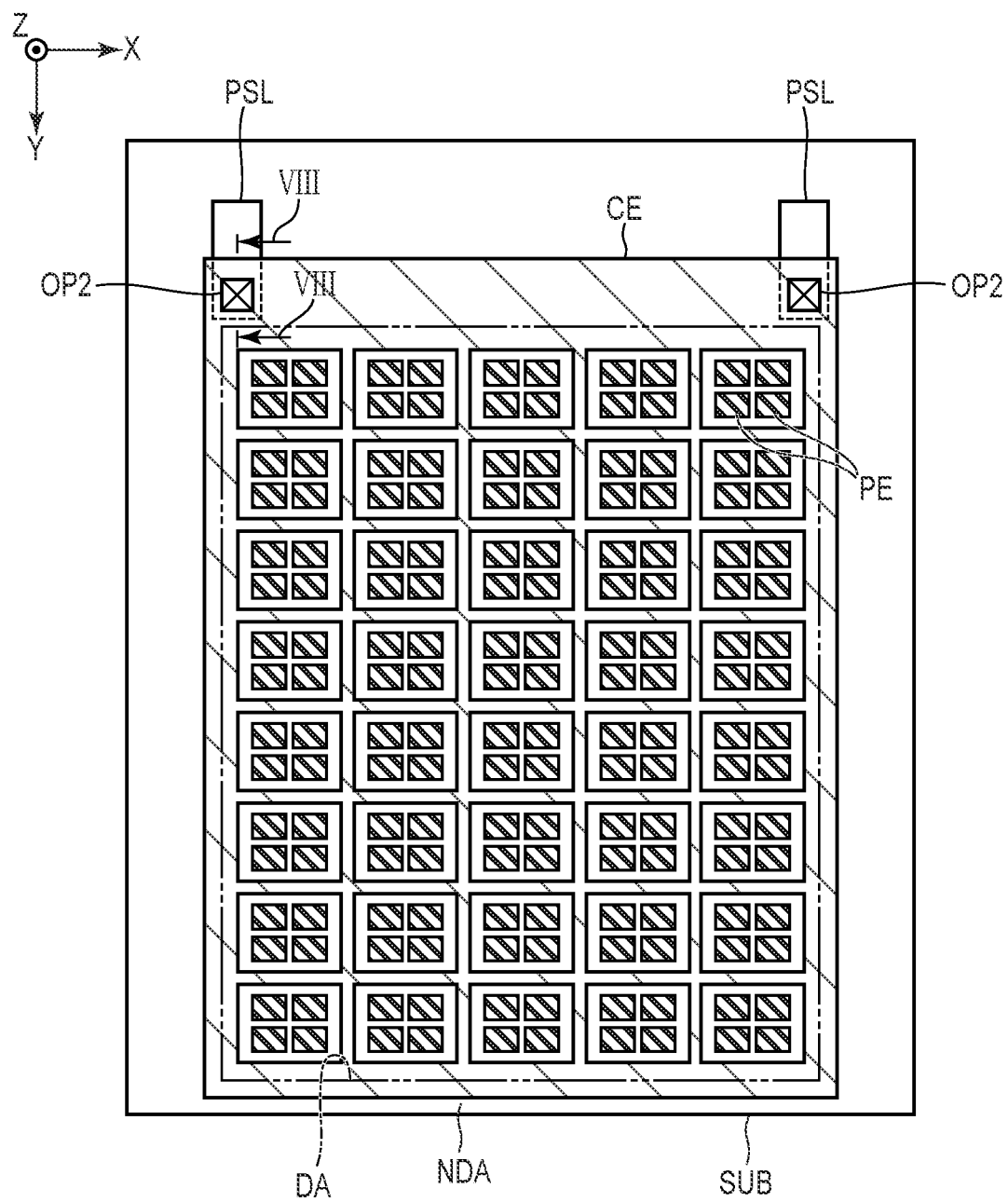
FIG. 7 is a plan view showing the display panel, illustrating an entire structure of power lines and the second mounting electrode.

Next, the overall structure of the second mounting electrode CE and the power supply lines will be described. FIG. 7 is a plan view showing the display panel 2, illustrating an entire structure of a power supply lines PSL and the second mounting electrode CE.

As shown in FIG. 7, the display panel 2 comprises the power supply lines PSL provided on the substrate SUB. In the present embodiment, the display panel 2 comprises two power supply lines PSL, but may comprise one or three or more power supply lines PSL. Each power supply line PSL is located in the non-display area NDA and is not located in the display area DA. In this embodiment, the power supply line PSL is connected to the low potential power supply and fixed to the low potential Pvss. The power supply line PSL functions as a second wiring layer.

The second mounting electrode CE is located in the entire display area DA and a part of the non-display area NDA. The second mounting electrode CE is overlaid on each power supply line PSL in the non-display area NDA. As will be described later in detail, the second mounting electrode CE is provided with a plurality of openings, and the first mounting electrode PE is exposed from the openings.

Figure 8:
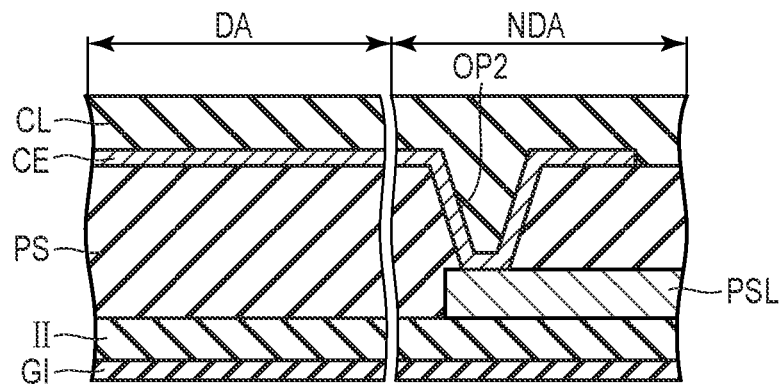

FIG. 8 is a partially cross-sectional view showing the display area DA and the non-display area NDA of the display panel 2 along line VIII-VIII of FIG. 7, illustrating the power supply line PSL, the second mounting electrode CE, and the like.

As shown in FIG. 8, the power supply line PSL is provided on the insulating layer II. The insulating layer PS is located not only in the display area DA but also in the non-display area NDA. In the non-display area NDA, the insulating layer PS covers the power supply line PSL and includes a second opening (contact hole) OP2 through which a part of each power supply line PSL is exposed. The second mounting electrode CE is provided on the insulating layer PS and is electrically connected to the power supply line PSL through the second opening OP2 in the non-display area NDA. The insulating layer PS does not include an opening for connecting the second mounting electrode CE and the power supply line PSL in the display area DA.

Figure 9:
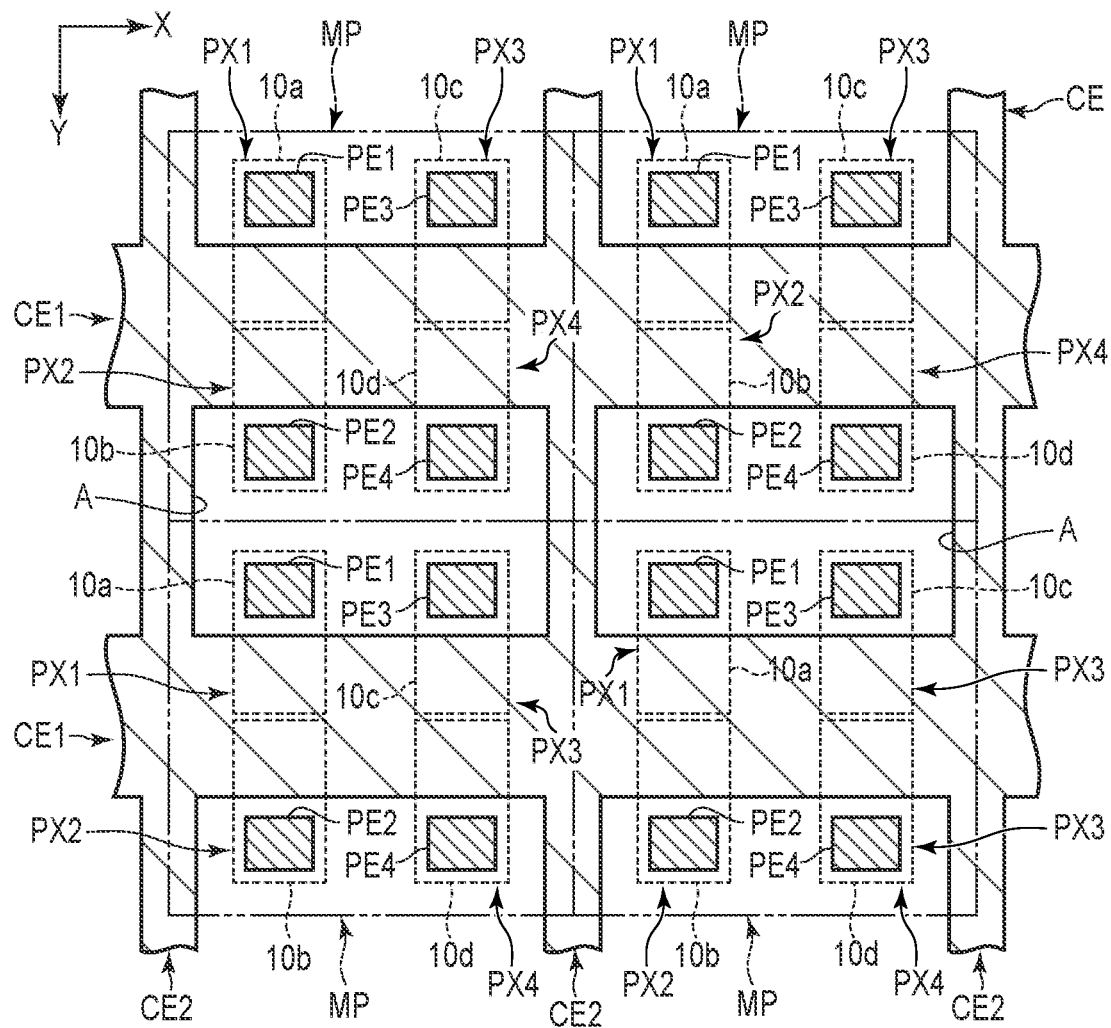
FIG. 9 is an enlarged plan view showing a part of the display area of the display panel, illustrating a part of the second mounting electrode and a plurality of first mounting electrodes.

Next, the configuration of the first mounting electrode PE, the second mounting electrode CE, and the light emitting element 10 will be described. FIG. 9 is an enlarged plan view showing a part of the display area DA of the display panel 2, illustrating a part of the second mounting electrode CE and the plurality of first mounting electrodes PE.

As shown in FIG. 9, the second mounting electrode CE includes a plurality of first portions CE1 and a plurality of second portions CE2. The plurality of first portions CE1 extend in the first direction X and are spaced apart at intervals and arranged in the second direction Y. The plurality of second portions CE2 extend in the second direction Y and are spaced apart at intervals and arranged in the first direction X, and intersect the plurality of first portions CE1. The second mounting electrode CE is formed by integrating the plurality of first portions CE1 and the plurality of second portions CE2. The second mounting electrode CE includes a plurality of openings A, and each opening A corresponds to a region surrounded by a pair of adjacent first portions CE1 and a pair of adjacent second portions CE2. The second mounting electrode CE has not only a function as an electrode, but also a function as a line.

In the present embodiment, the blue pixel PX functions as a first pixel PX1, the red pixel PX functions as a second pixel PX2, the white pixel PX functions as a third pixel PX3, and the green pixel PX functions as a fourth pixel PX4.

The first pixel PX1 includes a first mounting electrode PE1 and a light emitting element (first light emitting element) 10a that emits blue light. The second pixel PX2 includes a first mounting electrode PE2 and a light emitting element (second light emitting element) 10b that emits red light. The third pixel PX3 includes a first mounting electrode PE3 and a light emitting element (third light emitting element) 10c that emits white light. The fourth pixel PX4 includes a first mounting electrode PE4 and a light emitting element (first light emitting element) 10d that emits green light. The first pixel PX1, the second pixel PX2, the third pixel PX3, and the fourth pixel PX4 share the second mounting electrode CE. The length of one side of the light emitting element 10 which is a micro-LED is, for example, 100 μm or less in planar view.

In each area (opening A) surrounded by the pair of first portions CE1 adjacent to each other and the pair of second portions CE2 adjacent to each other, one or more first mounting electrodes, of the plurality of first mounting electrodes PE, are arranged. In the present embodiment, four first mounting electrodes are arranged in each opening A. In other words, the second mounting electrodes CE are arranged so as to individually surround one or more first mounting electrodes PE. In the present embodiment, the second mounting electrodes CE are arranged so as to individually surround four first mounting electrodes PE, i.e., the first mounting electrodes PE2 and PE4 of one main pixel MP and the first mounting electrodes PE1 and PE3 of the other main pixel MP. In each opening A, four first mounting electrodes PE are arranged and spaced apart at intervals.

Figure 10:
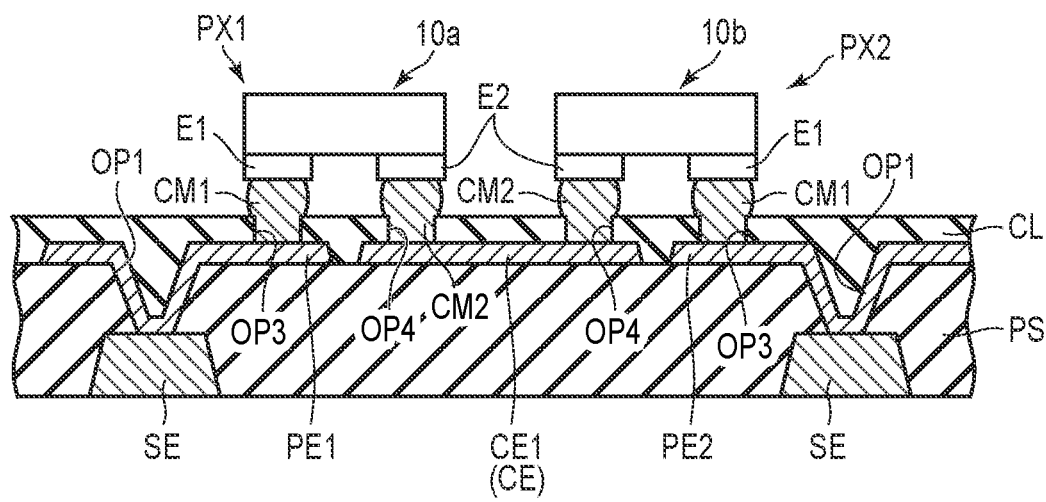

One first portion CE1 is located between the electrode group of the first mounting electrode PE1 and the first mounting electrode PE3 and the electrode group of the first mounting electrode PE2 and the first mounting electrode PE4, of one main pixel MP. The light emitting elements 10a to 10d are overlaid on the same first portion CE1 of the plurality of first portions CE1. In one main pixel MP, for example, the light emitting element 10a and the light emitting element 10b are arranged so as to have line symmetry in the second direction Y, and the light emitting element 10c and the light emitting element 10d are arranged so as to have line symmetry in the second direction Y. FIG. 10 is a cross-sectional view showing a part of the display area DA of the display panel 2, illustrating the first mounting electrodes PE, the second mounting electrode CE, the light emitting elements 10a and 10b, and the like. In FIG. 10, the first pixel PX1 and the second pixel PX2 of one main pixel MP are focused.

As shown in FIG. 10, the plurality of first mounting electrodes PE are located in the display area DA and provided on the insulating layer PS. Each of the first mounting electrodes PE is electrically connected to one of the plurality of source electrodes SE through one of the plurality of first openings OP1. The insulating layer CL covers the plurality of first mounting electrodes PE and second mounting electrodes CE. The insulating layer CL includes a plurality of openings through which a part of the upper surface of each first mounting electrode PE and a plurality of parts of the upper surface of the second mounting electrode CE are exposed. The plurality of openings are a plurality of third openings OP3 and a plurality of fourth openings OP4 located in the display area DA.

A part of the upper surface of each first mounting electrode PE is exposed to the outside of the insulating layer CL through the corresponding third opening OP3 of the plurality of third openings OP3. A plurality of parts of the upper surface of the first portion CE1 are exposed to the outside of the insulating layer CL through the plurality of fourth openings OP4, as a plurality of parts of the upper surface of the second mounting electrode CE.

The light emitting element 10a is mounted across the first mounting electrode PE1 and the second mounting electrode CE (first portion CE1). The light emitting element 10b is mounted across the other first mounting electrode PE2 and the second mounting electrode CE (first portion CE1). Each of the second electrode E2 of the light emitting element 10a and the second electrode E2 of the second light emitting element 10b is opposed to the same first portion CE1.

In the light emitting element 10a, the first electrode E1 is electrically connected to the first mounting electrode PE1 through the corresponding third opening OP3, and the second electrode E2 is electrically connected to the second mounting electrode CE (first portion CE1) through the fourth opening OP4. In the light emitting element 10b, the first electrode E1 is electrically connected to the other first mounting electrode PE2 through the corresponding third opening OP3, and the second electrode E2 is electrically connected to the second mounting electrode CE (first portion CE1) through the other fourth opening OP4.

Figure 11:
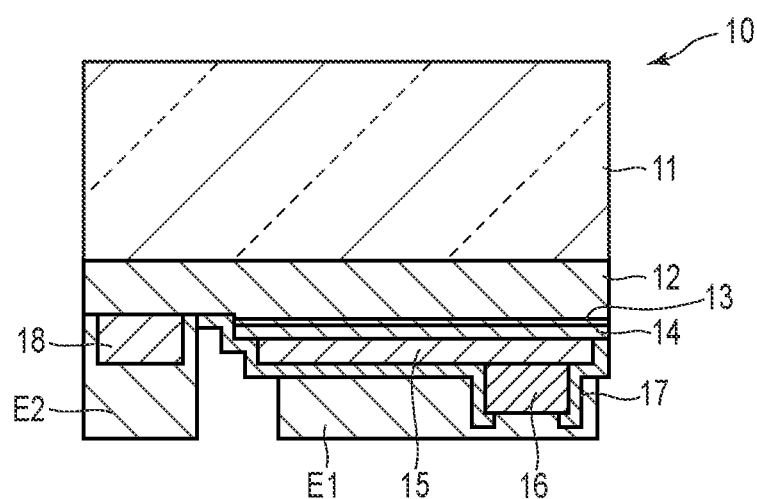
FIG. 11 is a cross-sectional view showing the light emitting element.

Next, an example of the structure of the light emitting element 10 will be described. FIG. 11 is a cross-sectional view showing the light emitting element 10.

As shown in FIG. 11, the light emitting element 10 is a flip-chip light emitting diode element. The light emitting element 10 comprises a transparent substrate 11 having an insulation property. The substrate 11 is, for example, a sapphire substrate. A crystal layer (semiconductor layer) in which an n-type semiconductor layer 12, an active layer (emitting layer) 13, and a p-type semiconductor layer 14 are sequentially stacked is formed on the main surface of the substrate 11. In the crystal layer (semiconductor layer), a region containing P-type impurities is the p-type semiconductor layer 14, and a region containing N-type impurities is the n-type semiconductor layer 12. The material of the crystal layer (semiconductor layer) is not particularly limited. However, the crystal layer (semiconductor layer) may contain gallium nitride (GaN) or gallium arsenide (GaAs).

A light-reflective film 15 is formed of a conductive material and is electrically connected to the p-type semiconductor layer 14. A p-electrode 16 is electrically connected to the light-reflective film 15. An n-electrode 18 is electrically connected to the n-type semiconductor layer 12. The second electrode E2 covers the n-electrode 18 and is electrically connected to the n-electrode 18. A protective layer 17 covers the n-type semiconductor layer 12, the active layer 13, the p-type semiconductor layer 14, and the light-reflective film 15, and partially covers the p-electrode 16. The first electrode E1 covers the p-electrode 16 and is electrically connected to the p-electrode 16.

In the display device 1 according to the first embodiment configured as described above, the second mounting electrode CE is arranged so as to surround the first mounting electrode PE. For this reason, the lines fixed to the low potential Pvss do not need to be laid out in the layer closer to the substrate SUB than the first mounting electrode PE. The area of the second mounting electrode CE can be thereby increased. For example, the margin can be expanded when mounting the light emitting element 10.

In addition, since the second mounting electrode CE is routed in the display area DA, the resistance of the second mounting electrode CE can be reduced. Furthermore, since the voltage drop of the second mounting electrode CE can be suppressed to the minimum limit, the uniformity of the electric potential in the entire display area DA of the second mounting electrode CE can be improved. Moreover, high definition of pixels can also be achieved.

In addition, by laying out the first mounting electrodes PE and the second mounting electrode CE in this manner, both electrodes can be formed of the same conductive layer. As a result, since the surface of the first mounting electrode PE and the surface of the second mounting electrode CE have the same height, the light emitting element 10 can be mounted desirably.

The main pixel MP shares the output switch BCT. The number of output switches BCT can be reduced to ¼ as compared with the case where one output switch BCT is provided for each pixel PX, and the number of the first scanning line Sga, the third scanning line Sgc, and the reset line Sgr can be reduced to ½, and the number of reset switches RST can be reduced to ½. For this reason, it is possible to contribute to narrowing the frame of the display device and improving the high definition of pixels.

From the above, a display device capable of improving high definition can be obtained.

Second Embodiment

Figure 12:
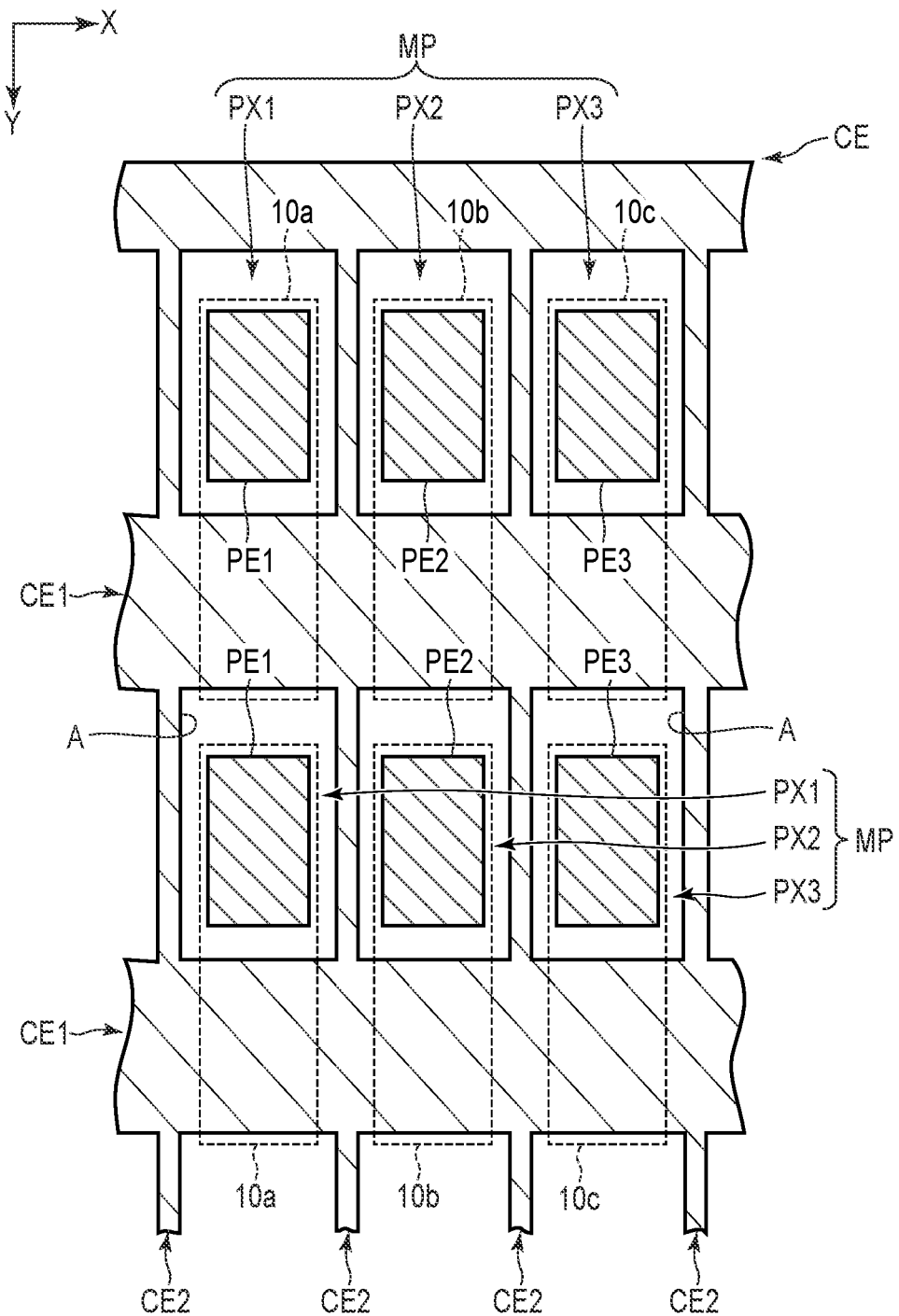
FIG. 12 is an enlarged plan view showing a plurality of first mounting electrodes and a second mounting electrode of a display device according to a second embodiment.

Next, a display device 1 according to a second embodiment will be described. FIG. 12 is an enlarged plan view showing a plurality of first mounting electrodes PE and second mounting electrodes CE of the display device 1 according to the second embodiment.

As shown in FIG. 12, a main pixel MP comprises three color pixels PX arranged in the first direction X. In each main pixel MP, a red pixel PX functions as a first pixel PX1, a green pixel PX functions as a second pixel PX2, and a blue pixel PX functions as a third pixel PX3. The first pixel PX1 includes a first mounting electrode PE1 and a light emitting element (first light emitting element) 10a that emits red light. The second pixel PX2 includes a first mounting electrode PE2 and a light emitting element (second light emitting element) 10b that emits green light. The third pixel PX3 includes a first mounting electrode PE3 and a light emitting element (third light emitting element) 10c that emits blue light.

In the example shown in FIG. 12, unlike the first embodiment, one first mounting electrode PE is arranged in each area (each opening A) surrounded by a pair of first portions CE1 adjacent to each other and a pair of second portions CE2 adjacent to each other. The first mounting electrodes PE1 and the second portions CE2 are alternately arranged in the first direction X. For this reason, the width of the second portion CE2 in the first direction X can become smaller as compared with the first embodiment.

The first mounting electrodes PE1 and the first portions CE1 are alternately arranged in the second direction Y. In two main pixels MP arranged in the second direction Y, the first portion CE1 used by one main pixel MP is different from the first portion CE1 used by the other main pixel MP. For this reason, the width of the first portion CE1 in the second direction Y can become smaller as compared with the first embodiment.

In the display device 1 of the second embodiment configured as described above, too, the same advantages as those of the first embodiment can be obtained. In the present embodiment, the first mounting electrodes PE1 and the second portions CE2 are alternately arranged in the first direction X. For this reason, the resistance of the second mounting electrode CE can be further lowered. In addition, the center of light emission can easily be determined.

Modified Example 1 of Second Embodiment

Figure 13:
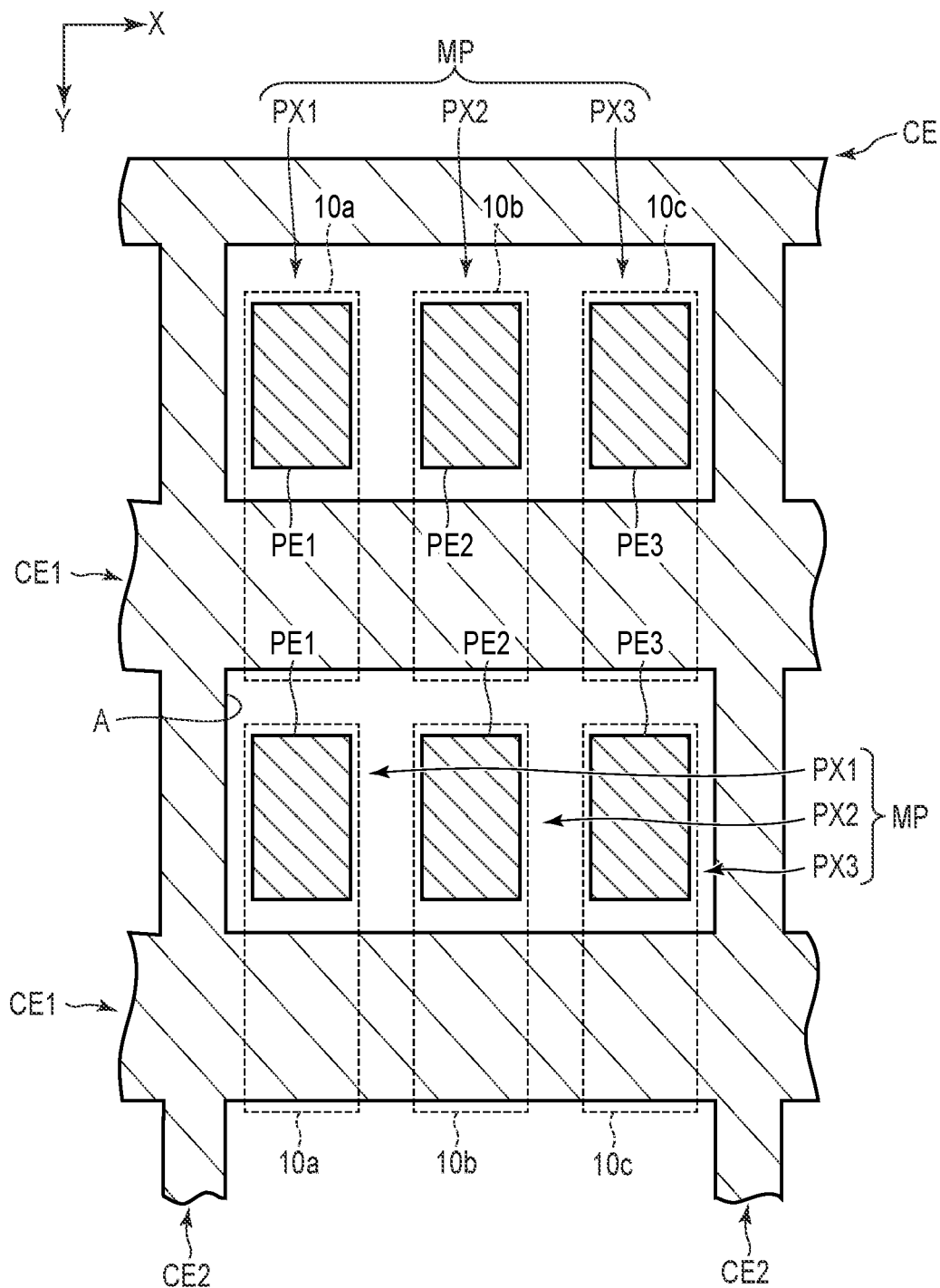
FIG. 13 is an enlarged plan view showing a plurality of first mounting electrodes and second mounting electrode of the display device according to a modified example 1 of the second embodiment.

Next, a modified example 1 of the second embodiment will be described. FIG. 13 is an enlarged plan view showing a plurality of first mounting electrodes PE and second mounting electrode CE of the display device 1 according to a modified example 1 of the second embodiment.

As shown in FIG. 13, the modified example is different from the second embodiment with respect to a feature that all the first mounting electrodes PE of one main pixel MP are arranged in each area (each opening A) surrounded by the pair of first portions CE1 adjacent to each other and the pair of second portions CE2 adjacent to each other.

In the display device 1 according to modified example 1 of the second embodiment configured as described above, too, the same advantages as those of the second embodiment can be obtained. In the modified example 1, unlike the second embodiment, the first mounting electrodes PE1 and the second portions CE2 are not alternately arranged in the first direction X. For this reason, the modified example is advantageous for improvement of high definition as compared with the second embodiment.

Modified Example 2 of Second Embodiment

Figure 14:
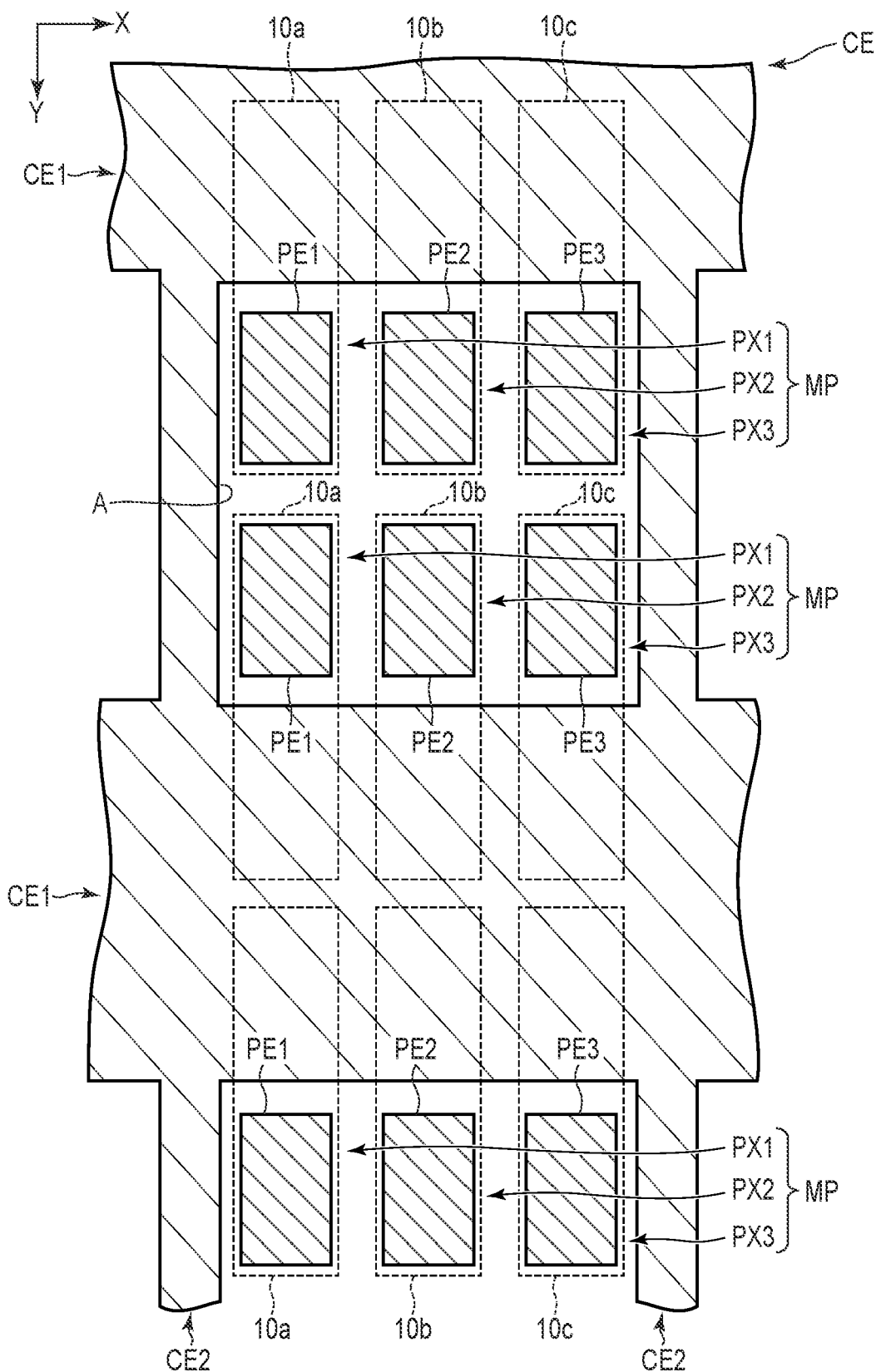
FIG. 14 is an enlarged plan view showing a plurality of first mounting electrodes and second mounting electrode of the display device according to a modified example 2 of the second embodiment.

Next, a modified example 2 of the second embodiment will be described. FIG. 14 is an enlarged plan view showing a plurality of first mounting electrodes PE and second mounting electrode CE of the display device 1 according to a modified example 2 of the second embodiment.

As shown in FIG. 14, the modified example is different from the modified example 1 with respect to a feature that all the first mounting electrodes PE of two main pixels MP adjacent in the second direction Y are arranged in each area (each opening A) surrounded by the pair of first portions CE1 adjacent to each other and the pair of second portions CE2 adjacent to each other. In addition, all the light emitting elements 10 of two main pixels MP arranged in the second direction Y are overlaid on the same first portion CE1 of the plurality of first portions CE1. Two light emitting elements 10 adjacent in the second direction Y are arranged to have line symmetry in the second direction Y.

In the display device 1 according to modified example 2 of the second embodiment configured as described above, too, the same advantages as those of the second embodiment can be obtained. In the modified example 2, two main pixels MP adjacent in the second direction Y use the same first portion CE1. For this reason, the layout efficiency of the second mounting electrode CE can be improved as compared with the second embodiment.

Modified Example 3 of Second Embodiment

Figure 15:
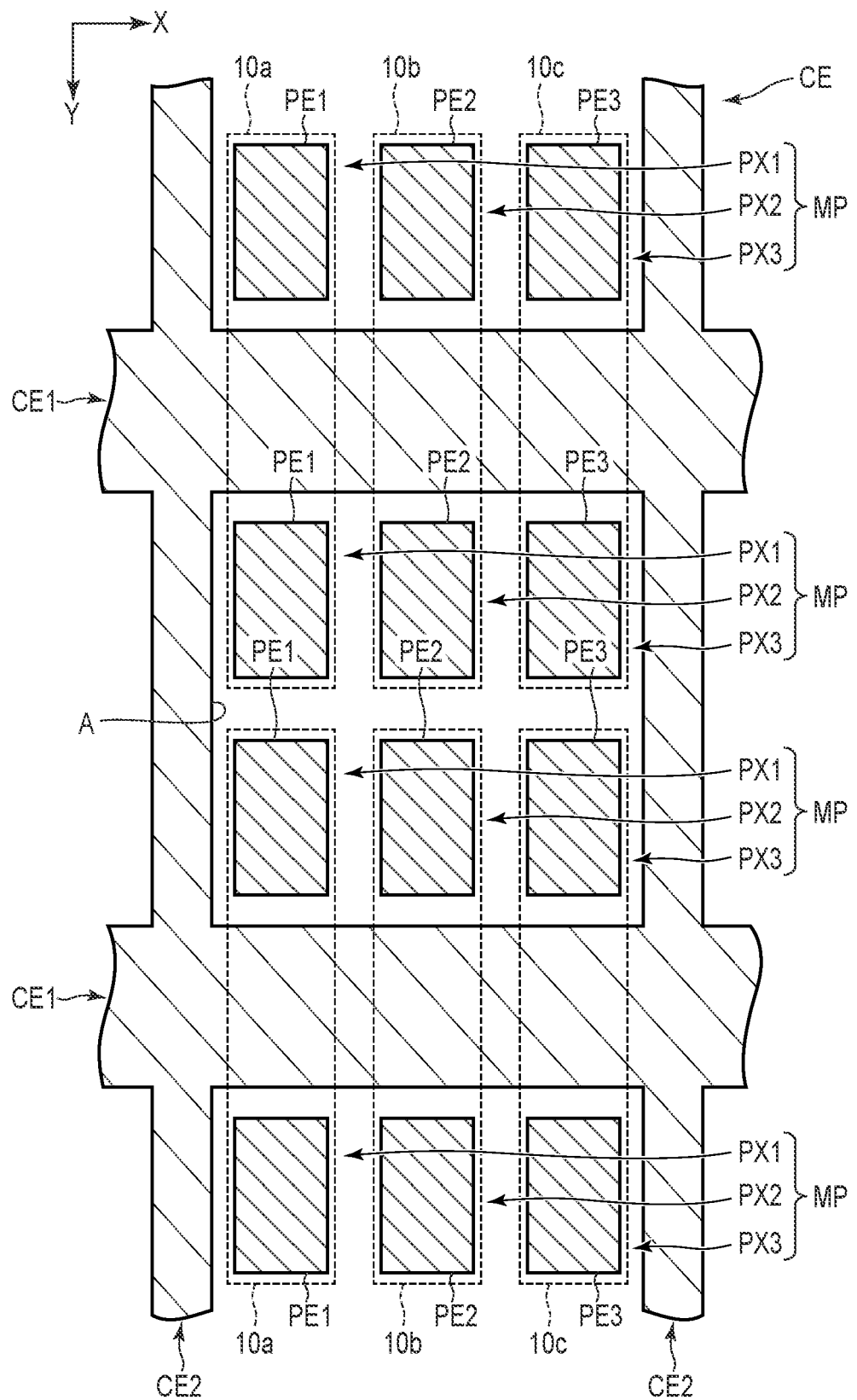
FIG. 15 is an enlarged plan view showing a plurality of first mounting electrodes and second mounting electrode of the display device according to a modified example 3 of the second embodiment.

Next, a modified example 3 of the second embodiment will be described. FIG. 15 is an enlarged plan view showing a plurality of first mounting electrodes PE and second mounting electrode CE of the display device 1 according to a modified example 3 of the second embodiment.

As shown in FIG. 15, the modified example 3 is different from the second embodiment with respect to a feature that each light emitting element 10 is mounted across the pair of first mounting electrodes PE and the first portion CE1 of the second mounting electrodes CE, which is located between the pair of first mounting electrodes PE. Each light emitting element 10 is shared by a pair of pixels PX of the same color of two main pixels MP adjacent in the second direction Y.

Figure 16:
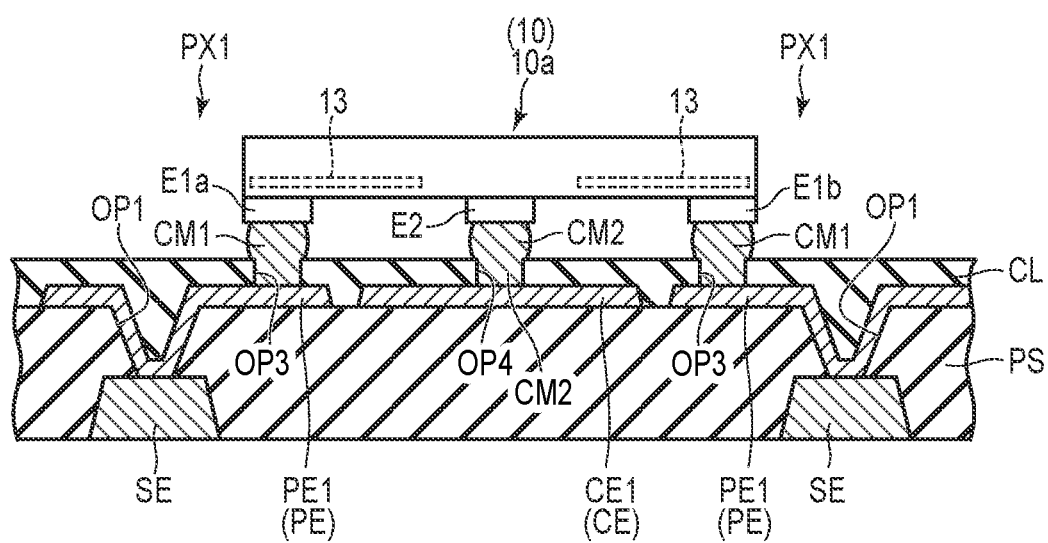

FIG. 16 is a cross-sectional view showing a part of the display area DA of the display panel 2 according to the modified example 3, illustrating the first mounting electrodes PE, the second mounting electrode CE, the light emitting element 10, and the like. A pair of pixels PX1 of the same color of two main pixels MP adjacent in the second direction Y are shown in FIG. 16. Incidentally, the relationship between the pair of first pixels PX1 shown in FIG. 16 is the same as the relationship between the pair of second pixels PX2 and the pair of third pixels PX3.

As shown in FIG. 16, the light emitting element 10 further comprises a first electrode E1a, another first electrode E1b, and a second electrode E2. The light emitting element 10 includes a sequential semiconductor layer. The semiconductor layer of the light emitting element 10 includes two emitting layers 13a and 13b located and separated from each other at an interval. In the light emitting element 10, the first electrode E1a and the first electrode E1b are connected to a pair of first mounting electrodes PE in a one-to-one relationship. The second electrode E2 is connected to the first portion CE1 located between the pair of first mounting electrodes PE, of the second mounting electrode CE.

The emitting layer 13a emits light by allowing a current to flow between the first electrode E1a and the second electrode E2. The other emitting layer 13b emits light by allowing a current to flow between the first electrode E1b and the second electrode E2. The emitting layer 13a and the emitting layer 13b emit light of the same color.

In the display device 1 according to modified example 3 of the second embodiment configured as described above, too, the same advantages as those of the second embodiment can be obtained. In the modified example 3, since the light emitting element 10 emitting light at two portions is used, the light emitting element 10 can be arranged more efficiently.

Modified Example 4 of Second Embodiment

Next, a modified example 4 of the second embodiment will be described. FIG. 17 is an enlarged plan view showing a plurality of first mounting electrodes PE and second mounting electrode CE of the display device 1 according to a modified example 4 of the second embodiment.

As shown in FIG. 17, the modified example 4 is different from the second embodiment with respect to a feature that the plurality of light emitting elements 10 of each main pixel MP are not arranged in a vertical stripe shape (i.e., are not arranged in the first direction X). In each main pixel MP, the plurality of light emitting elements 10 may be arranged to be close to each other and arranged as a group. In the modified example 4, in one main pixel MP, the light emitting element 10a and the light emitting element 10c are adjacent to each other in the first direction X, and the light emitting element 10b is adjacent to the light emitting element 10a and the light emitting element 10c in the second direction Y.

The light emitting element 10a is overlaid on the first mounting electrode PE1 and a part of the second mounting electrode CE which is adjacent to the first mounting electrode PE1 in the second direction Y. The light emitting element 10c is overlaid on the first mounting electrode PE3 and a part of the second mounting electrode CE which is adjacent to the first mounting electrode PE3 in the second direction Y. The light emitting element 10b is overlaid on the first mounting electrode PE2 and a part of the second mounting electrode CE which is adjacent to the first mounting electrode PE2 in the first direction X.

The second mounting electrodes CE are laid out so as to match the arrangement pattern of the light emitting elements 10. For this reason, the opening A may have a shape different from a square as in the modified example 4.

In the display device 1 according to modified example 4 of the second embodiment configured as described above, too, the same advantages as those of the second embodiment can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The arrangement pattern of the plurality of light emitting elements 10 of each main pixel MP is not limited to the above-mentioned examples, but can be variously modified. For example, the plurality of light emitting elements 10 of the main pixel MP may be arranged in a horizontal stripe shape and, in other words, may be arranged in the second direction Y.

What is claimed is:

1. A display device comprising:
a plurality of first wiring layers provided on a substrate and located in a display area;
a second wiring layer provided on the substrate and located in a non-display area other than the display area;
a first insulating layer located in the display area and the non-display area, covering the plurality of first wiring layers and the second wiring layer, and including a plurality of first openings exposing parts of the plurality of first wiring layers, respectively;
a plurality of first mounting electrodes located in the display area and provided on the first insulating layer, each of the plurality of first mounting electrodes being electrically connected to one of the plurality of first wiring layers through one of the plurality of first openings;
a second mounting electrode provided on the first insulating layer and located in the display area and the non-display area;
a first light emitting element; and
a second light emitting element,
the second mounting electrode being arranged to surround a first mounting electrode of the plurality of first mounting electrodes and an other first mounting electrode of the plurality of first mounting electrodes,
the first light emitting element being mounted across the first mounting electrode of the plurality of first mounting electrodes and the second mounting electrode, and including a first electrode electrically connected to the first mounting electrode of the plurality of first mounting electrodes and a second electrode electrically connected to the second mounting electrode,
the second light emitting element being mounted across the other first mounting electrode of the plurality of first mounting electrodes and the second mounting electrode, and including a first electrode electrically connected to the other first mounting electrode of the plurality of first mounting electrodes and a second electrode electrically connected to the second mounting electrode,
the first insulating layer including a second opening located in the non-display area,
the second mounting electrode being electrically connected to the second wiring layer through the second opening, in the non-display area.

2. The display device of claim 1, wherein
the first insulating layer does not include an opening for connecting the second mounting electrode and the second wiring layer in the display area.

3. The display device of claim 1, wherein
the plurality of first mounting electrodes and the second mounting electrode are provided in a same layer.

4. The display device of claim 1, wherein
each of the first light emitting element and the second light emitting element is a light-emitting diode element including a semiconductor layer which includes a region containing a P-type impurity, a region containing a N-type impurity, and an emitting layer.

5. The display device of claim 4, wherein
each of the first light emitting element and the second light emitting element further comprises an other first electrode,
the semiconductor layer of each of the first light emitting element and the second light emitting element further includes an other emitting layer,
the emitting layer of each of the first light emitting element and the second light emitting element emits light by allowing a current to flow between the first electrode and the second electrode, and
the other emitting layer of each of the first light emitting element and the second light emitting element emits light by allowing an other current to flow between the other first electrode and the second electrode.

6. The display device of claim 5, wherein
each of the first light emitting element and the second light emitting element is mounted across the first mounting electrode of the plurality of first mounting electrodes and the other first mounting electrode of the plurality of first mounting electrodes, and a part of the second mounting electrode which is located between the first mounting electrode of the plurality of first mounting electrode and the other first mounting electrode of the plurality of first mounting electrodes.

7. The display device of claim 6, wherein
in each of the first light emitting element and the second light emitting element, the first electrode and the other first electrode are connected to the first mounting electrode of the plurality of first mounting electrodes and the other first mounting electrode of the plurality of first mounting electrodes, respectively in a one-to-one relationship, and the second electrode is connected to the part of the second mounting electrode.

8. The display device of claim 4, wherein
the semiconductor layer contains GaN or GaAs.

9. The display device of claim 1, further comprising:
a second insulating layer covering the plurality of first mounting electrodes and the second mounting electrode, and including a plurality of openings through which a part of an upper surface of each of the plurality of first mounting electrodes and a plurality of parts of an upper surface of the second mounting electrode are exposed.

10. The display device of claim 1, further comprising:
a second insulating layer covering the plurality of first mounting electrodes and the second mounting electrode, and including a plurality of third openings and a plurality of fourth openings located in the display area, wherein
a part of an upper surface of each of the plurality of first mounting electrodes is exposed to an outside of the second insulating layer through a corresponding third opening of the plurality of third openings,
a plurality of parts of an upper surface of the second mounting electrode are exposed to the outside of the second insulating layer through the plurality of fourth openings,
in the first light emitting element, the first electrode is electrically connected to the first mounting electrode of the plurality of first mounting electrodes through the corresponding third opening of the plurality of third openings, and the second electrode is electrically connected to the second mounting electrode through a fourth opening of the plurality of fourth openings, and
in the second light emitting element, the first electrode is electrically connected to the other first mounting electrode of the plurality of first mounting electrodes through an other corresponding third opening of the plurality of third openings, and the second electrode is electrically connected to the second mounting electrode through an other fourth opening of the plurality of fourth openings.

11. The display device of claim 1, wherein
the second mounting electrode includes a plurality of first portions extending in a first direction and spaced apart at intervals and arranged in a second direction intersecting the first direction, and a plurality of second portions extending in the second direction, spaced apart at intervals and arranged in the first direction and intersecting the plurality of first portions, and
one or more first mounting electrodes, of the plurality of first mounting electrodes, are arranged in each of regions surrounded by a pair of first portions of the plurality of first portions adjacent to each other and a pair of second portions of the plurality of second portions adjacent to each other.

12. The display device of claim 11, wherein
two or more first mounting electrodes, of the plurality of first mounting electrodes, are arranged in each of the regions,
a first portion of the plurality of first portions is located between the first mounting electrode of the plurality of first mounting electrodes and the other first mounting electrode of the plurality of first mounting electrodes, and
the second electrode of the first light emitting element and the second electrode of the second light emitting element are on opposite ends of the first portion of the plurality of first portions.

* * * * *